(12) United States Patent
Hsieh et al.

(10) Patent No.: US 9,094,004 B2
(45) Date of Patent: Jul. 28, 2015

(54) TRANSMITTER SYSTEM WITH DIGITAL PHASE ROTATOR USED FOR APPLYING DIGITAL PHASE ROTATION TO CONSTELLATION DATA AND RELATED SIGNAL TRANSMISSION METHOD THEREOF

(71) Applicant: MediaTek Inc., Hsin-Chu (TW)

(72) Inventors: Ming-Yu Hsieh, Taichung (TW); Chi-Hsueh Wang, Kaohsiung (TW); Pou-Chi Chang, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/280,683

(22) Filed: May 19, 2014

(65) Prior Publication Data

US 2014/0348217 A1 Nov. 27, 2014

Related U.S. Application Data

(60) Provisional application No. 61/825,630, filed on May 21, 2013.

(51) Int. Cl.
*H04L 25/49* (2006.01)
*H03K 19/0175* (2006.01)
*H03F 3/217* (2006.01)
*H04L 27/34* (2006.01)
*H04B 1/04* (2006.01)
(Continued)

(52) U.S. Cl.
CPC ........ *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC ............ H04L 27/3444; H04L 27/3405; H04L 27/3411; H04B 1/0475; H04B 2001/045
USPC .................. 375/295, 296, 297, 259, 260, 285
See application file for complete search history.

(56) References Cited

U.S. PATENT DOCUMENTS 6,473,506 B1* 10/2002 Hook et al. .................... 379/279
7,058,139 B2* 6/2006 Duperray ...................... 375/297
(Continued)

FOREIGN PATENT DOCUMENTS

EP 1 758 282 A1 2/2007
EP 2 461 498 A1 6/2012
(Continued)

*Primary Examiner* — Siu Lee
(74) *Attorney, Agent, or Firm* — Winston Hsu; Scott Margo

(57) ABSTRACT

A transmitter system includes a digital phase rotator, a phase rotation controller, and a digital radio-frequency (RF) transmitter. The digital phase rotator receives a first constellation data, and applies a digital phase rotation to the received first constellation data to generate a second constellation data. The phase rotation controller configures the digital phase rotation. The digital RF transmitter receives a digital input data derived from the second constellation data, and converts the digital input data into an analog RF output.

16 Claims, 9 Drawing Sheets

(51) Int. Cl.
- *H04W 24/02* (2009.01)
- *H04L 25/02* (2006.01)
- *H04L 25/08* (2006.01)
- *H03M 1/12* (2006.01)
- *H04L 7/00* (2006.01)
- *G01R 21/06* (2006.01)
- *G01R 23/00* (2006.01)
- *H03F 1/24* (2006.01)
- *H04L 27/20* (2006.01)

(56) References Cited

U.S. PATENT DOCUMENTS 7,990,298 B1 * 8/2011 Friedmann et al. ........... 341/118
2002/0168026 A1 11/2002 Khoini-Poorfard
2004/0264599 A1 12/2004 Lliev
2005/0156662 A1 7/2005 Raghupathy et al.
2010/0002670 A1 1/2010 Dent
2010/0239038 A1 * 9/2010 Seyedi-Esfahani ........... 375/261
2011/0013683 A1 * 1/2011 Cepeda Lopez ............... 375/224
2012/0294346 A1 * 11/2012 Kolze ............................ 375/224
2013/0170524 A1 7/2013 Hasegawa

FOREIGN PATENT DOCUMENTS

| | | |
|---|---|---|
| WO | 9959265 A1 | 11/1999 |
| WO | 2008038210 A2 | 4/2008 |
| WO | 2008038210 A3 | 4/2008 |
| WO | 2012049912 A1 | 4/2012 |

* cited by examiner

TRANSMITTER SYSTEM WITH DIGITAL PHASE ROTATOR USED FOR APPLYING DIGITAL PHASE ROTATION TO CONSTELLATION DATA AND RELATED SIGNAL TRANSMISSION METHOD THEREOF

CROSS REFERENCE TO RELATED APPLICATIONS

This application claims the benefit of U.S. provisional application No. 61/825,630, filed on May 21, 2013 and incorporated herein by reference.

BACKGROUND

The disclosed embodiments of the present invention relate to wireless signal transmission, and more particularly, to a transmitter system with a digital phase rotator used for applying a digital phase rotation to a constellation data and a related signal transmission method thereof.

The peak-to-average power ratio (PAPR) of a transmit signal is an important parameter in a communication system because it determines the back-off factor that needs to be applied to the power amplifier in order to avoid clipping of the transmit signal and hence spectral regrowth. In general, the power amplifier is used to boost radiation power out of an antenna. The transfer function of the power amplifier should be linear to avoid undesired distortion. In practice, the power amplifier may exhibit a linear transfer characteristic only at a low input signal level. When the input signal level is too high, nonlinear distortion occurs, resulting in clipping and spectral regrowth. Therefore, to maintain tight spectral confinement of the transmit signal, the efficiency of the power amplifier has to be reduced. In other words, when the PAPR is high, this puts a stringent requirement on the power amplifier, and reduces the efficiency in the sense that larger back-off is needed to maintain the linearity.

Because of the advance of the deep sub-micro complementary metal-oxide-semiconductor (CMOS) process, digital circuits become smaller and consume less power. That is, the process scaling allows more transistors implemented in the same area or a smaller area needed for implementing the same number of transistors. Hence, to reduce the device size and prolong battery life for the portable device such as a mobile phone, it is desirable to implement circuits in deep sub-micron CMOS process. Regarding the radio design, there is a strong push to convert the radio-frequency (RF)/analog intensive radio parts into more digital intensive designs to take full advantage of the process scaling. For example, a digital radio-frequency (RF) transmitter may be employed in a communication system. However, the transmission PAPR would reduce the allowable output power range of the digital RF transmitter. Thus, there is a need for an innovative design which is capable of controlling and minimizing the digital RF transmitter's PAPR to achieve better power efficiency.

SUMMARY

In accordance with exemplary embodiments of the present invention, a transmitter system with a digital phase rotator used for applying a digital phase rotation to a constellation data and a related signal transmission method thereof are proposed to solve the above-mentioned problem.

According to a first aspect of the present invention, an exemplary transmitter system is disclosed. The exemplary transmitter system includes a digital phase rotator, a phase rotation controller, and a digital radio-frequency (RF) transmitter. The digital phase rotator receives a first constellation data, and applies a digital phase rotation to the received first constellation data to generate a second constellation data. The phase rotation controller configures the digital phase rotation. The digital RF transmitter receives a digital input data derived from the second constellation data, and converts the digital input data into an analog RF output.

According to a second aspect of the present invention, an exemplary signal transmission method is disclosed. The exemplary signal transmission method includes: receiving a first constellation data; configuring a digital phase rotation; applying the digital phase rotation to the received first constellation data to generate a second constellation data; and utilizing a digital radio-frequency (RF) transmitter to receive a digital input data derived from the second constellation data and convert the digital input data into an analog RF output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The key idea of the present invention is to use a constellation phase rotation to make a digital RF transmitter have better performance, such as lower PAPR, higher power efficiency and/or less distorted spectrum. The phase rotation angle employed by the constellation phase rotation may be constellation data dependent, transmitter architecture dependent and/or power amplifier dependent. Further details of the proposed constellation phase rotation scheme are described as below.

Figure 1:
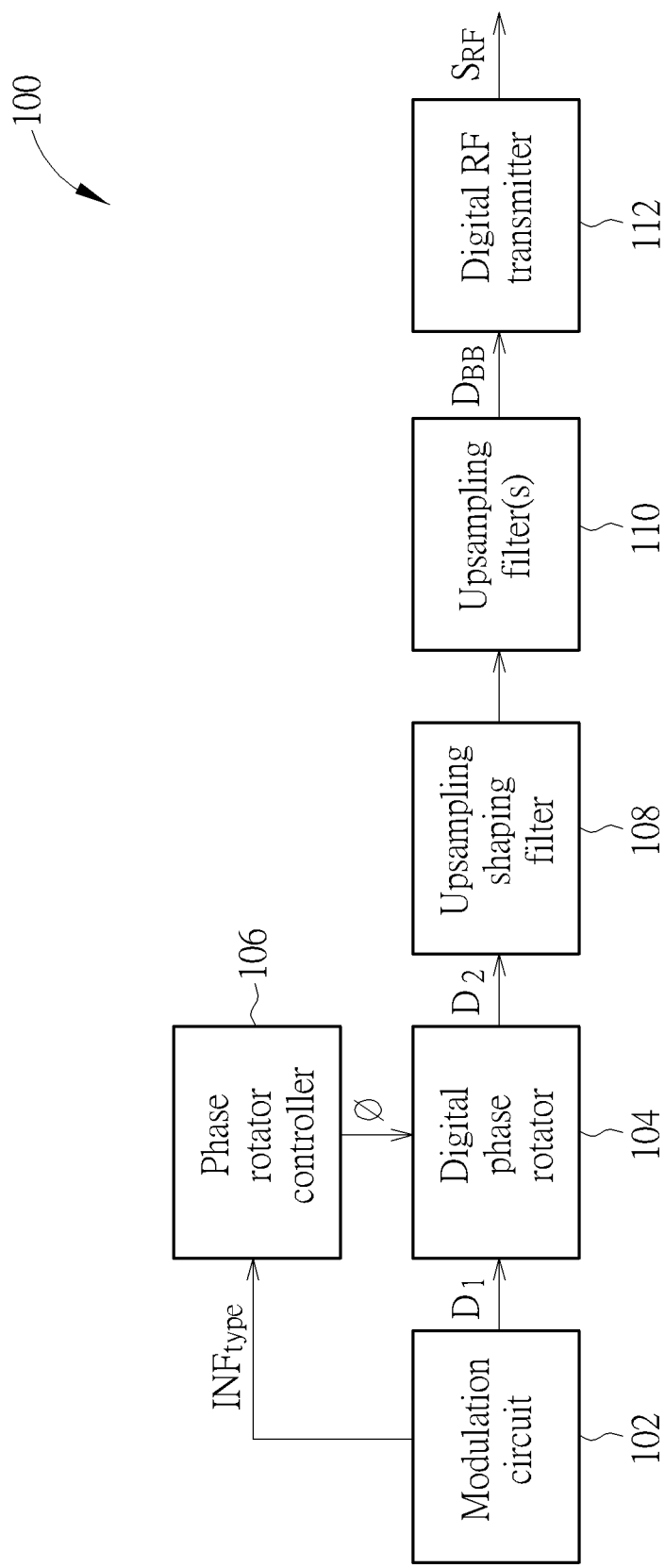
FIG. 1 is a block diagram illustrating a transmitter system according to an embodiment of the present invention.

FIG. 1 is a block diagram illustrating a transmitter system according to an embodiment of the present invention. The transmitter system 100 may be part of a transceiver employed by an electronic device such as a mobile phone. The transmitter system 100 includes, but is not limited to, a modulation circuit 102, a digital phase rotator 104, a phase rotator controller 106, a upsampling shaping filter 108, at least one upsampling filter 110, and a digital radio-frequency (RF) transmitter 112. The modulation circuit 102 is arranged to generate a first constellation data $D_1$ according to an employed modulation scheme, and generate constellation type information $INF_{type}$ to inform the phase rotator controller 106 of a constellation type of the first constellation data $D_1$ (i.e., type of the employed modulation scheme). For example, the employed modulation scheme maybe QPSK (Quadrature Phase Shift Keying), 16-QAM (Quadrature Amplitude Modulation), 32-QAM or 64-QAM, depending upon actual signal transmission requirement.

The digital phase rotator 104 is coupled to the modulation circuit 102, and arranged to receive the first constellation data $D_1$ and apply a digital phase rotation $e^{j\phi}$ to the received first constellation data $D_1$ to generate a second constellation data $D_2$ (i.e., $D_2=D_1 \cdot e^{j\phi}$). The phase rotation controller 106 is coupled to the modulation circuit 102 and the digital phase rotator 104, and arranged to configure the digital phase rotation $e^{j\phi}$ according to at least the constellation type of the first constellation data $D_1$. For example, the phase rotation controller 106 refers to the constellation type to set a phase rotation angle $\phi$ employed by the digital phase rotation $e^{j\phi}$ performed by the digital phase rotator 104 upon the first constellation data $D_1$. Further description of the proposed constellation phase rotation will be detailed later.

The digital RF transmitter 112 is arranged to receive a digital input data $D_{BB}$ derived from the second constellation data $D_2$, and convert the digital input data $D_{BB}$ into an analog RF output $S_{RF}$ to be transmitted over the air through an antenna (not shown). In this embodiment, the digital input data $D_{BB}$ is generated from sequentially processing the second constellation data $D_2$ by upsampling shaping filter 108 and upsampling filter(s) 110 disposed between the digital phase rotator 104 and the digital RF transmitter 112. However, this is for illustrative purposes only, and is not meant to be a limitation of the present invention. In an alternative design, the upsampling shaping filter 108 and/or the upsampling filter(s) 110 may be omitted; the upsampling shaping filter 108 and/or the upsampling filter(s) 110 may be replaced by other signal processing circuits; or additional signal processing circuit(s) may be inserted between the digital phase rotator 104 and the digital RF transmitter 112.

The digital RF transmitter 112 may receive a digital baseband input, and then generate an analog RF output. Specifically, the digital RF transmitter 112 may be designed to employ one digital RF transmitter architecture, and have one or more digital power amplifiers, such as RF digital-to-analog converters (RF-DACs), based on the employed digital RF transmitter architecture. By way of example, but not limitation, the employed digital RF transmitter architecture may be one of DIQ architecture, DQC architecture and DQM architecture.

Figure 2:
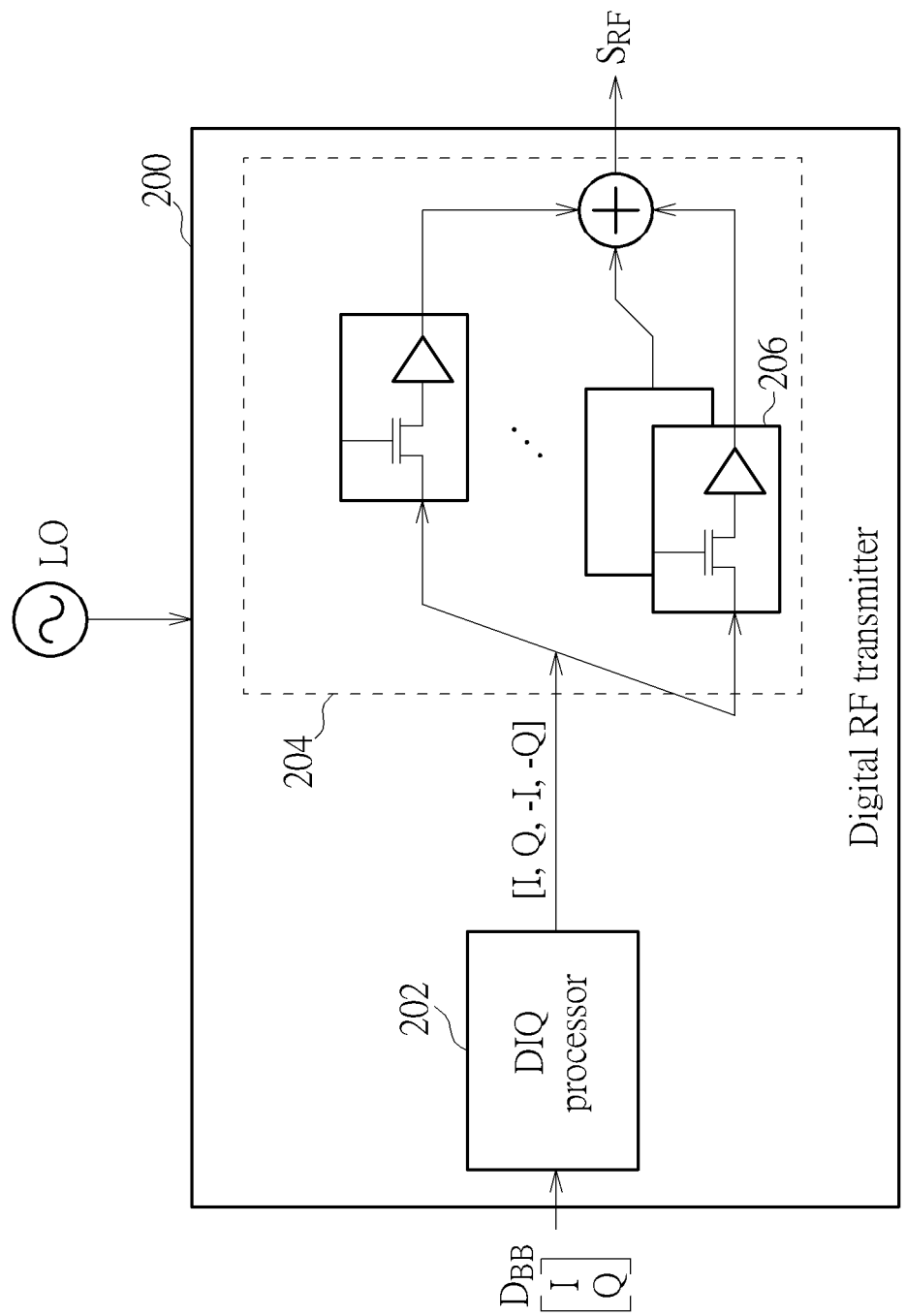
FIG. 2 is a diagram illustrating a digital RF transmitter employing DIQ architecture according to an embodiment of the present invention.

Please refer to FIG. 2, which is a diagram illustrating a digital RF transmitter employing the DIQ architecture according to an embodiment of the present invention. The digital RF transmitter 112 shown in FIG. 1 may be implemented using the digital RF transmitter 200 shown in FIG. 2. In this embodiment, the digital RF transmitter 200 includes a DIQ processor 202 and a digital power amplifier (e.g., an RF-DAC) 204. Since the digital RF transmitter 200 is equipped with one digital power amplifier only, the DIQ processor 202 preceding the digital power amplifier 204 is therefore arranged to do a parallel-to-serial conversion upon the digital input data $D_{BB}$ (e.g., parallel IQ [I, Q]) and generate a serial DIQ input data [I, Q, −I, −Q] based on an in-phase data I and a quadrature data Q included in the digital input data $D_{BB}$. Each power amplifier cell 206 in the digital power amplifier 204 is clocked by a local oscillator (LO) frequency. Hence, the digital power amplifier 204 converts the digital input data $D_{BB}$ (e.g., parallel IQ [I, Q]) into the analog RF output $S_{RF}$ by sequentially processing the serial DIQ input data [I, Q, −I, −Q].

Figure 3:
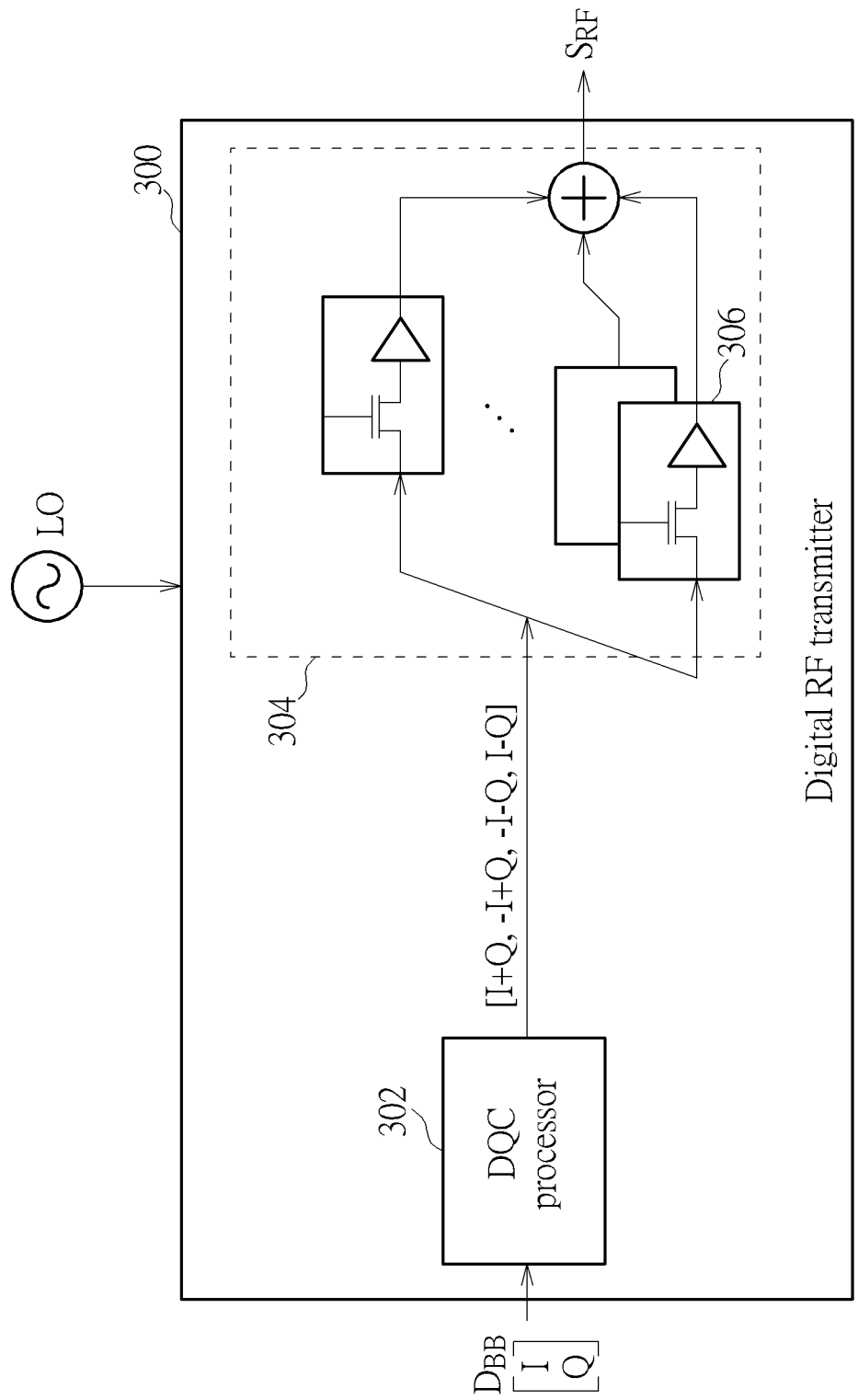
FIG. 3 is a diagram illustrating a digital RF transmitter employing DQC architecture according to an embodiment of the present invention.

Please refer to FIG. 3, which is a diagram illustrating a digital RF transmitter employing the DQC architecture according to an embodiment of the present invention. The digital RF transmitter 112 shown in FIG. 1 may be implemented using the digital RF transmitter 300 shown in FIG. 3. In this embodiment, the digital RF transmitter 300 includes a DQC processor 302 and a digital power amplifier (e.g., an RF-DAC) 304. Since the digital RF transmitter 300 is equipped with one digital power amplifier only, the DQC processor 302 preceding the digital power amplifier 304 is therefore arranged to do a parallel-to-serial conversion upon the digital input data $D_{BB}$ (e.g., parallel IQ [I, Q]) and generate a serial DQC input data [I+Q, −I+Q, −I−Q, I−Q] based on an in-phase data I and a quadrature data Q individually included in the digital input data $D_{BB}$. Each power amplifier cell 306 in the digital power amplifier 304 is clocked by a local oscillator (LO) frequency. Hence, the digital power amplifier 304 converts the digital input data $D_{BB}$ (e.g., parallel IQ [I, Q]) into the analog RF output $S_{RF}$ by sequentially processing the serial DQC input data [I+Q, −I+Q, −I−Q, I−Q].

Figure 4:
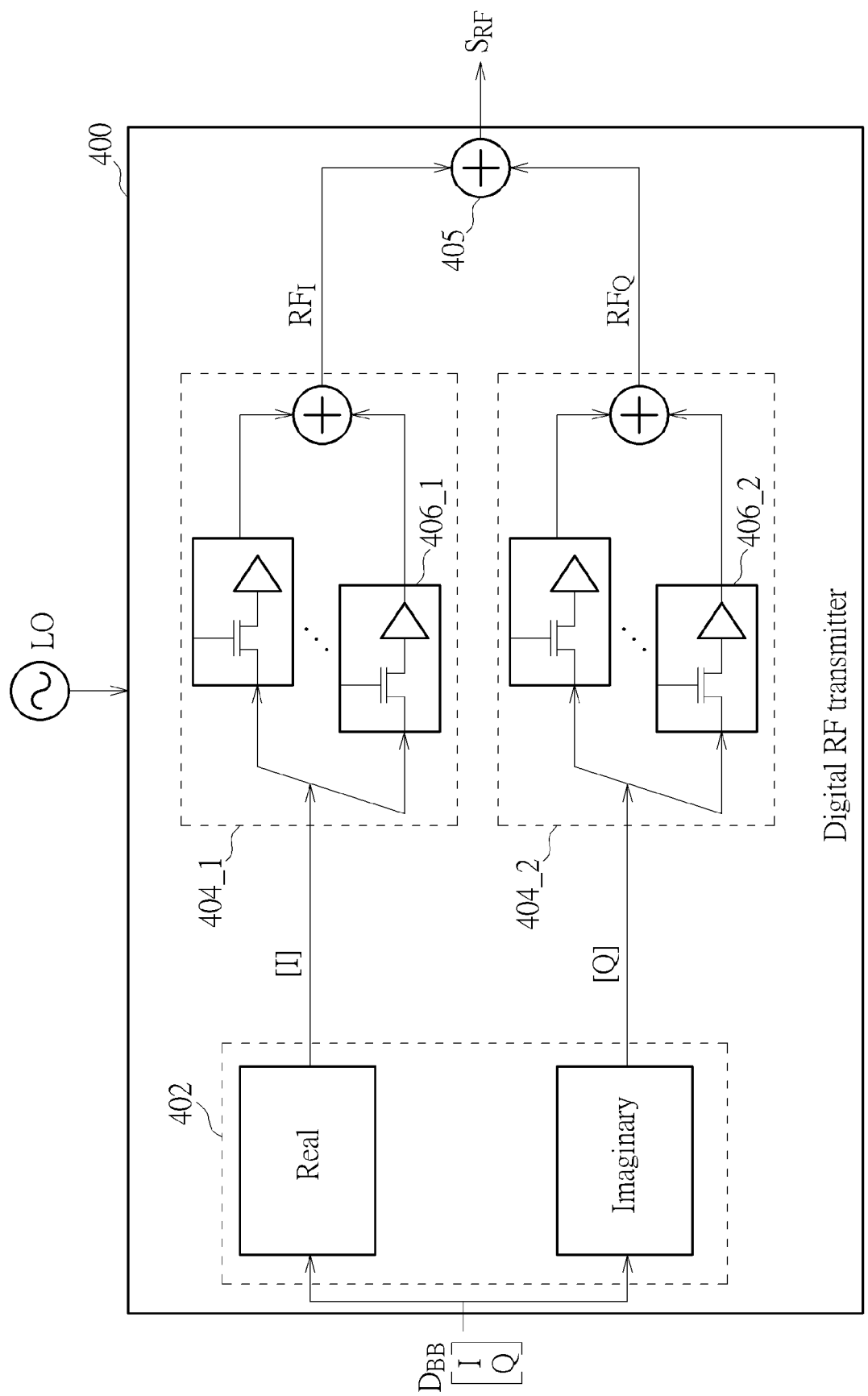
FIG. 4 is a diagram illustrating a digital RF transmitter employing DQM architecture according to an embodiment of the present invention.

Please refer to FIG. 4, which is a diagram illustrating a digital RF transmitter employing the DQM architecture according to an embodiment of the present invention. The digital RF transmitter 112 shown in FIG. 1 may be implemented using the digital RF transmitter 400 shown in FIG. 4. In this embodiment, the digital RF transmitter 400 includes a DQM processor 402, plurality of digital power amplifiers (e.g., RF-DACs) 404_1, 404_2, and an adder 405 acting as a signal combiner. The DQM processor 402 is arranged to separate the digital input data $D_{BB}$ (e.g., parallel IQ [I, Q]) into an in-phase data I and a quadrature data Q, and output the in-phase data I and the quadrature data Q to the digital power amplifiers 404_1, 404_2, respectively. Each power amplifier cell 406_1 in the digital power amplifier 404_1 is clocked by a local oscillator (LO) frequency, and each power amplifier cell 406_2 in the digital power amplifier 404_2 is also clocked by the same LO frequency. Hence, the digital power amplifier 404_1 converts the in-phase data I into an analog in-phase RF output $RF_I$, and the digital power amplifier 404_2 converts the quadrature data Q into an analog quadrature RF output $RF_Q$. Next, the adder 405 combines the analog in-phase RF output $RF_I$ and the analog quadrature RF output $RF_Q$ to generate the analog RF output $S_{RF}$.

Figure 5:
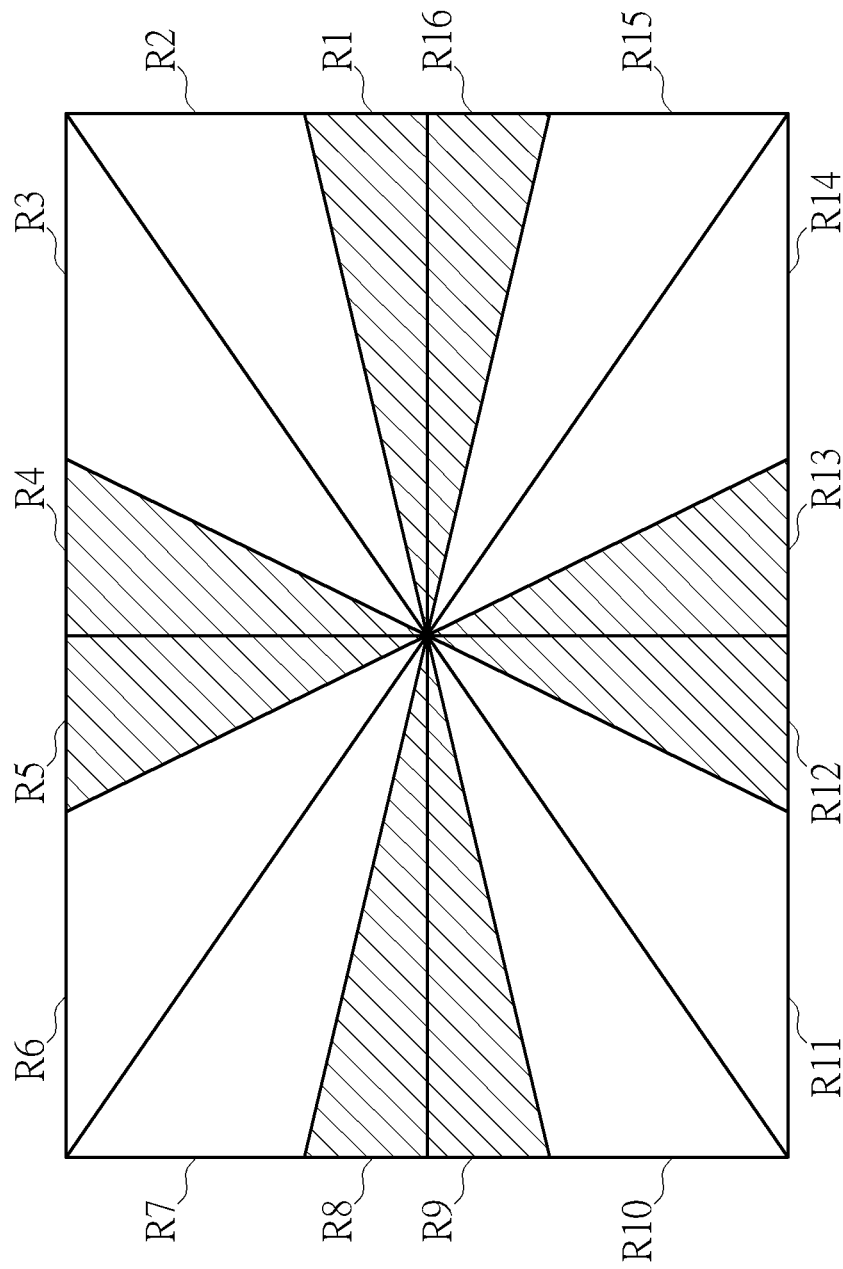
FIG. 5 is a diagram illustrating a plurality of constellation regions that favor different digital RF transmitter architecture for lower PAPR/higher power efficiency.

The constellation region favors different input data patterns under different digital RF transmitter architecture for lower PAPR/higher power efficiency. Please refer to FIG. 5, which is a diagram illustrating a plurality of constellation regions that favor different digital RF transmitter architecture for lower PAPR/higher power efficiency. In a case where the digital RF transmitter 112 employs the aforementioned DIQ architecture, constellation data represented by constellation points located within constellation regions R2, R3, R6, R7, R10, R11, R14, R15 would make the digital RF transmitter 112 have lower PAPR/higher power efficiency, and constellation data represented by constellation points located within constellation regions R1, R4 R5, R8, R9, R12, R13, R16 would make the digital RF transmitter 112 have higher PAPR/lower power efficiency. In another case where the digital RF transmitter 112 employs the aforementioned DQC architecture, constellation data represented by constellation points located within constellation regions R1, R4 R5, R8, R9, R12, R13, R16 would make the digital RF transmitter 112 have lower PAPR/higher power efficiency, and constellation data represented by constellation points located within constellation regions R2, R3, R6, R7, R10, R11, R14, R15 would make the digital RF transmitter 112 have higher PAPR/lower power efficiency.

Figure 6:
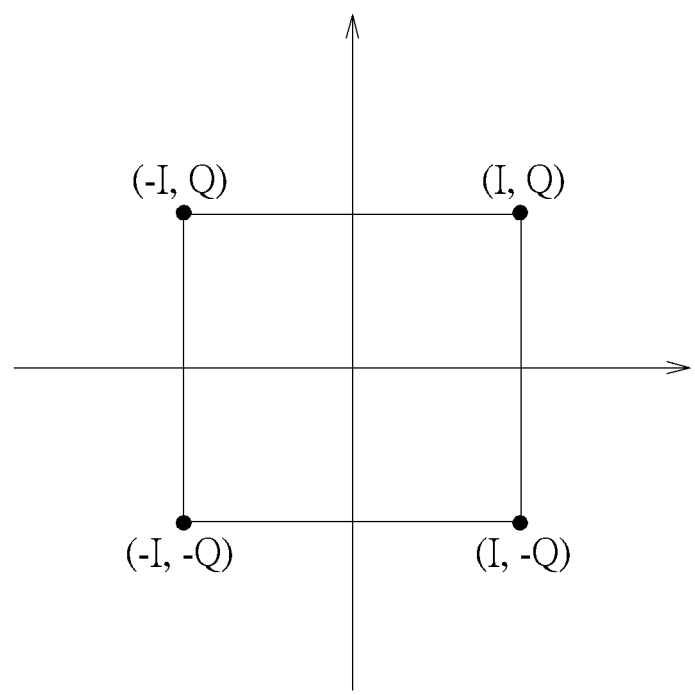
FIG. 6 is a diagram illustrating a constellation data source according to a QPSK modulation scheme.
Figure 7:
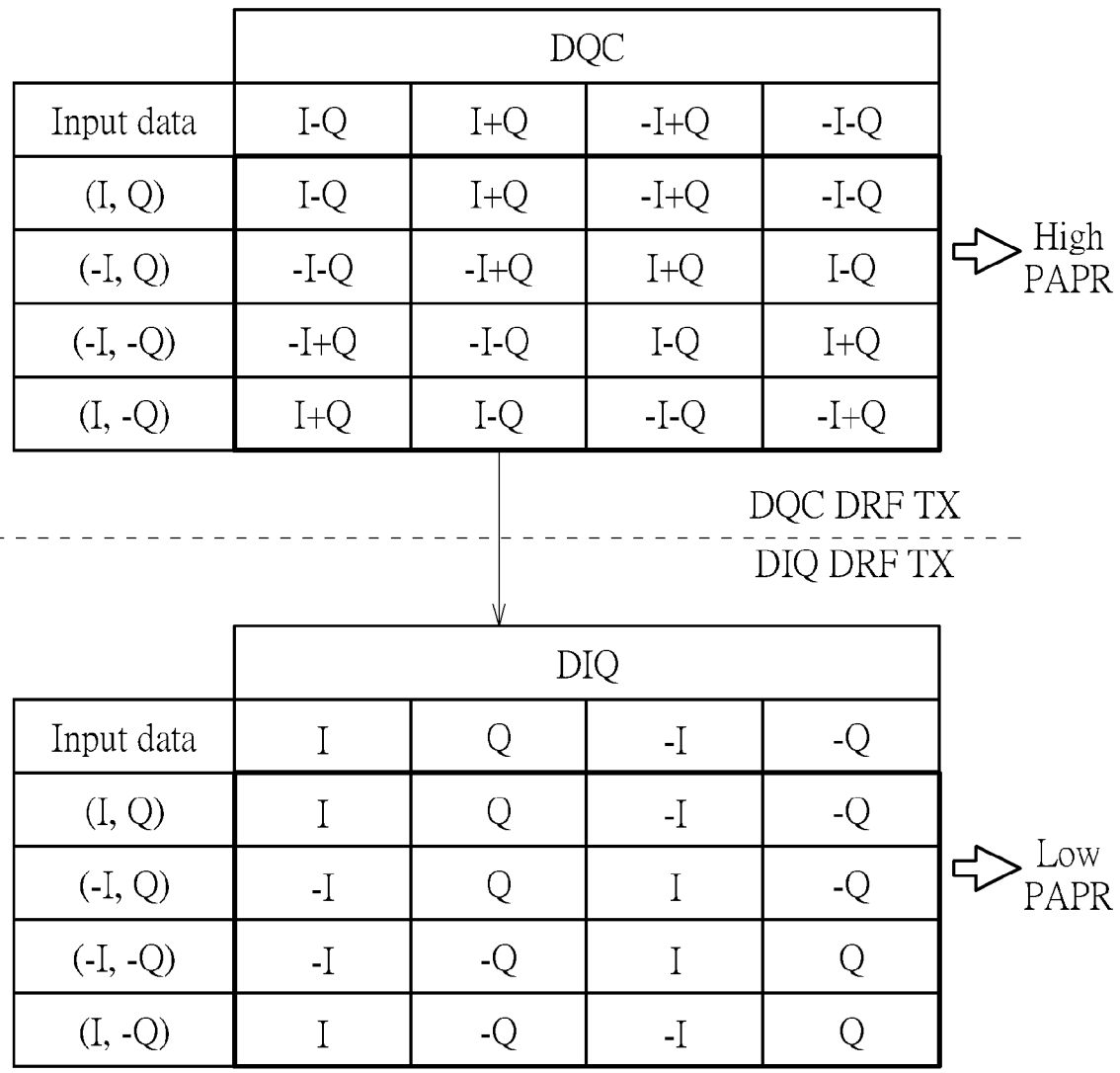
FIG. 7 is a diagram illustrating data patterns processed by digital RF transmitters with different transmitter architecture according to an embodiment of the present invention.

Please refer to FIG. 6 in conjunction with FIG. 7. FIG. 6 is a diagram illustrating a constellation data source according to a QPSK modulation scheme. FIG. 7 is a diagram illustrating data patterns processed by digital RF transmitters with different transmitter architecture according to an embodiment of the present invention. As shown in FIG. 6, each constellation data to be processed by a digital RF transmitter (DRF TX) may be one of the data patterns (I, Q), (–I, Q), (–I, –Q) and (I, –Q). If one constellation data generated from the QPSK modulation scheme is fed into the digital RF transmitter 300 with the DQC architecture, the DQC processor 302 is operative to convert the constellation data into the serial DQC input data. As shown in FIG. 7, the input data (I, Q) is converted into the serial DQC input data [I–Q, I+Q, –I+Q, –I–Q], the input data (–I, Q) is converted into the serial DQC input data [–I–Q, I+Q, I+Q, I–Q], the input data (–I, –Q) is converted into the serial DQC input data [–I+Q, –I–Q, I–Q, I+Q], and the input data (I, –Q) is converted into the serial DQC input data [I+Q, I–Q, –I–Q, –I+Q]. Since a constellation point having any of the data patterns (I, Q), (–I, Q), (–I, –Q) and (I, –Q) is not within one of constellation regions R1, R4 R5, R8, R9, R12, R13, R16 favored by DQC DRF TX, the serial DQC input data would have large fluctuation and thus result in a high PAPR.

However, if one constellation data generated from the QPSK modulation scheme is instead fed into the digital RF transmitter 200 with the DIQ architecture, the DIQ processor 202 is operative to convert the constellation data into the serial DIQ input data. As shown in FIG. 7, the input data (I, Q) is converted into the serial DIQ input data [I, Q, –I, –Q], the input data (–I, Q) is converted into the serial DIQ input data [–I, Q, I, –Q], the input data (–I, –Q) is converted into the serial DIC input data [–I, –Q, I, Q], and the input data (I, –Q) is converted into the serial DIQ input data [I, –Q, –I, Q]. Since a constellation point having any of the data patterns (I, Q), (–I, Q), (–I, –Q) and (I, –Q) is within one of constellation regions R1, R4 R5, R8, R9, R12, R13, R16 favored by DQC DRF TX, the serial DIQ input data would have small fluctuation and thus result in a low PAPR.

Figure 8:
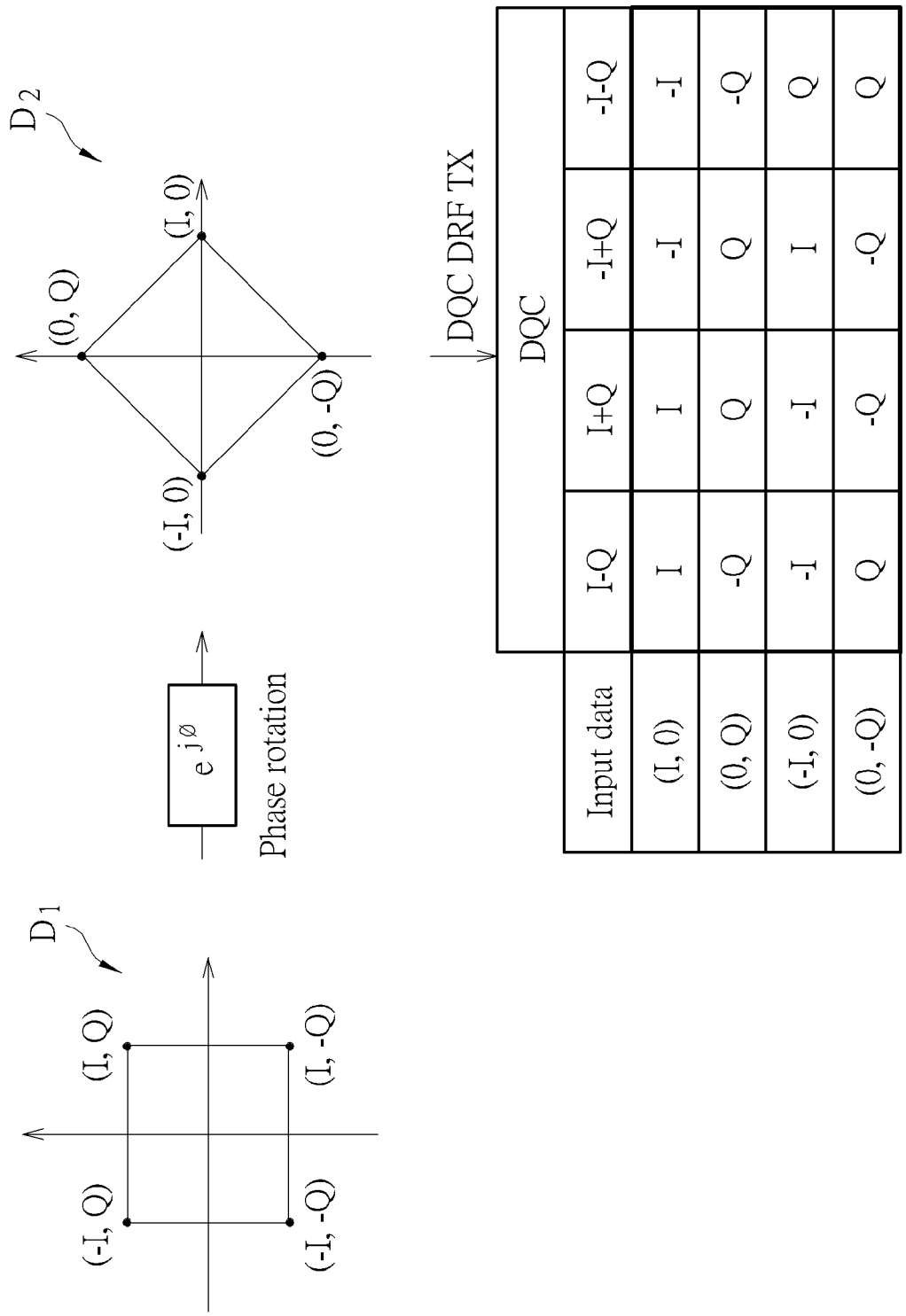
FIG. 8 is a diagram illustrating an exemplary constellation phase rotation according to an embodiment of the present invention.

Based on above observation, the present invention therefore proposes using the constellation phase rotation to make the constellation data rotated to constellation regions favored by the digital RF transmitter architecture to thereby minimize the PAPR and/or maximize the power efficiency. Please refer to FIG. 1 in conjunction with FIG. 8. FIG. 8 is a diagram illustrating an exemplary constellation phase rotation according to an embodiment of the present invention. Suppose that the modulation circuit 102 adopts a QPSK modulation scheme to generate the first constellation data $D_1$, and the digital RF transmitter 112 is designed to employ the DQC architecture. Hence, the constellation data $D_1$ may be one of the data patterns (I, Q), (–I, Q), (–I, –Q) and (I, –Q), as shown in FIG. 8. Based on the constellation type indicated by the constellation type information $INF_{type}$, the phase rotator controller 106 may set the phase rotation angle $\phi$ by +90° or –90°. It should be noted that the setting of the phase rotation angle $\phi$ is for illustrative purposes only, and is not meant to be a limitation of the present invention. In practice, the setting of the phase rotation angle $\phi$ may be dependent upon additional factor(s), and is not necessarily the above-mentioned angle value +90° or –90°.

Next, the digital phase rotator 104 applies a digital phase rotation $e^{j\phi}$ to the first constellation data $D_1$ to thereby generate the second constellation data $D_2$. As shown in FIG. 8, the second constellation data $D_2$ may be one of the data patterns (I, 0), (0, Q), (–I, 0) and (0, –Q). Considering a case where the second constellation data $D_2$ is directly used as the digital input data $D_{BB}$ fed into the digital RF transmitter 112 with the DQC architecture, the second constellation data $D_2$ is converted into a serial DQC input data. For example, when $D_2$=(I, 0), the serial DQC input data would be [I, I, –I, –I]; when $D_2$=(0, Q), the serial DQC input data would be [–Q, Q, Q, –Q]; when $D_2$=(–I, 0), the serial DQC input data would be [–I, –I, I, I]; and when $D_2$=(0, –Q), the serial DQC input data would be [Q, –Q, –Q, Q]. Since a constellation point having any of the data patterns (I, 0), (0, Q), (–I, 0) and (0, –Q) is within one of constellation regions R1, R4 R5, R8, R9, R12, R13, R16 favored by DQC DRF TX, the serial DIQ input data would have small fluctuation and thus result in a low PAPR.

The PAPR reduction achieved by the proposed constellation phase rotation may be expressed using following equation.

$$\Delta PAPR = 20 * \log_{10}\left(\frac{\sqrt{I^2}}{\sqrt{I^2+Q^2}}\right) = -3 \text{ dB}, \quad (1)$$

where $I = Q$

As shown in FIG. 1, there is at least one shaping filter coupled between the digital phase rotator 104 and the digital RF transmitter 112. Though the distribution of the constellation point may be randomly spread around the expected location by the shaping filter, the PAPR reduction is still achieved by the proposed constellation phase rotation. For example, under the presence of the shaping filter, the PAPR reduction may be –2.61 dB (i.e., $\Delta PAPR \cong -2.61$ dB).

As mentioned above, the digital RF transmitter architecture favors certain constellation regions to have lower PAPR/higher power efficiency. Hence, when the constellation type of the first constellation data $D_1$ corresponds to a first modulation scheme, the phase rotation controller 106 may set the phase rotation angle $\phi$ by a first angle value; and when the constellation type of the first constellation data $D_1$ corresponds to a second modulation scheme different from the first modulation scheme, the phase rotation controller 106 may set the phase rotation angle $\phi$ by a second angle value different from the first angle value. Therefore, a configuration of the digital phase rotation performed by the digital phase rotator 104 may also be dependent upon transmitter architecture employed by the digital RF transmitter 112. Briefly summarized, the PAPR of the digital RF transmitter 112 generating the analog RF output $S_{RF}$ based on the digital input $D_{BB}$ is lower than the PAPR of the digital RF transmitter 112 generating an analog RF output based on a digital input derived from the first constellation data $D_1$ without the proposed digital phase rotation applied thereto. Similarly, the power efficiency of the digital RF transmitter 112 generating the analog RF output $S_{RF}$ based on the digital input $D_{BB}$ is higher than the power efficiency of the digital RF transmitter 112 generating an analog RF output based on a digital input derived from the first constellation data $D_1$ without the proposed digital phase rotation applied thereto.

Further, the configuration of the digital phase rotation performed by the digital phase rotator 104 may also be dependent upon inherent characteristics of digital power amplifier(s) of the digital RF transmitter 112. For example, due to nonlinearity of the digital power amplifier, the digital power amplifier may favor certain constellation regions to generate a less distorted spectrum. If the constellation data is represented by a constellation point located outside constellation regions favored by the digital power amplifier, the analog RF output generated from the digital power amplifier based on the constellation data may be clipped, thus resulting in a spectrum distortion. Hence, when the inherent characteristic of the digital power amplifier is taken into consideration, the phase rotation angle φ may be properly set to achieve a less distorted spectrum. Briefly summarized, the spectrum of the analog RF output $S_{RF}$ generated by the digital RF transmitter 112 based on the digital input $D_{BB}$ is less distorted than the spectrum of an RF output generated by the digital RF transmitter 112 based on a digital input derived from the first constellation data $D_1$ without the proposed digital phase rotation applied thereto.

Figure 9:
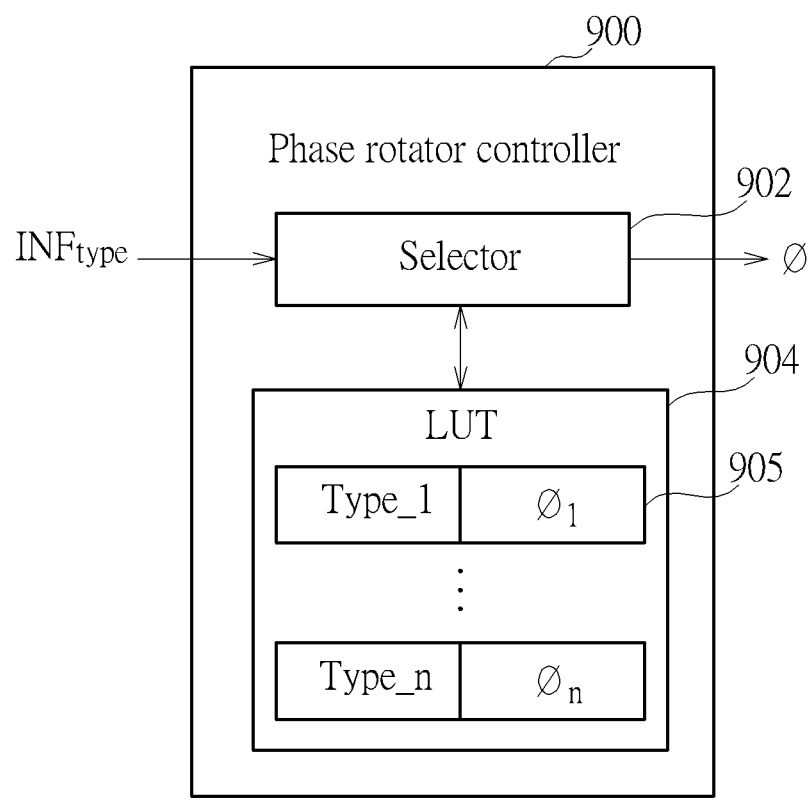
FIG. 9 is a block diagram illustrating a phase rotator controller according to an embodiment of the present invention.

In one exemplary design, the phase rotator controller 106 may determine the phase rotation angle φ by table lookup. Please refer to FIG. 9, which is a block diagram illustrating a phase rotator controller according to an embodiment of the present invention. The phase rotator controller 106 shown in FIG. 1 may be implemented using the phase rotator controller 900 shown in FIG. 9. The phase rotator controller 900 includes a selector 902 and a lookup table (LUT) 904. The LUT 904 includes a plurality of table entries 905, each recording a predetermined constellation type and an associated pre-built phase rotation angle. In other words, the LUT 904 is arranged to record a plurality of predetermined constellation types Type_1-Type_n and a plurality of pre-built phase rotation angles $\phi_1$-$\phi_n$, where the pre-built phase rotation angles $\phi_1$-$\phi_n$ are mapped to the predetermined constellation types Type_1-Type_n, respectively.

Each of the pre-built phase rotation angles $\phi_1$-$\phi_n$ is obtained by testing the digital RF transmitter 112 under a test mode. For example, the PAPR/power efficiency characteristic of the digital RF transmitter architecture under different constellation types is predictable and fixed, and thus can be known by the circuit designer in advance. The inherent characteristic of each digital power amplifier under a constellation type can be estimated by feeding a test data into the digital power amplifier and then analyzing an analog output of the digital power amplifier. To find a best phase rotation angle for a predetermined constellation type that can make the digital RF transmitter have the minimum PAPR, the maximum power efficiency and/or the least distorted spectrum, an initial guess of the phase rotation angle can be made based on the PAPR/power efficiency characteristic of the digital RF transmitter architecture under the constellation type and the inherent characteristic of digital power amplifier(s) under the constellation type. A test constellation data having the predetermined constellation type and adjusted by the initial phase rotation angle is fed into the digital RF transmitter 112, and then an analog RF output generated from the digital RF transmitter 112 is measured and recorded. A search algorithm may be adopted to change the phase rotation angle based on successive analog RF outputs of the digital RF transmitter 112, so as to find a target phase rotation angle which can make the digital RF transmitter have the desired performance (e.g., minimum PAPR, maximum power efficiency and/or least distorted spectrum). The found target phase rotation angle is recorded into the LUT 904 as a pre-built phase rotation angle for the predetermined constellation type. In this way, the LUT 904 is created and stored in an on-chip non-volatile memory (e.g., a flash memory).

However, the above is for illustrative purposes only, and is not meant to be a limitation of the present invention. A different manner for testing the digital RF transmitter 112 to find the pre-built phase rotation angles $\phi_1$-$\phi_n$ may be used. That is, the present invention has no limitation on the manner of deciding the pre-built phase rotation angles $\phi_1$-$\phi_n$. Hence, no matter how the LUT 904 is created, any transmitter system using the proposed constellation phase rotation scheme to achieve lower PAPR, higher power efficiency and/or less distorted spectrum falls within the scope of the present invention.

The selector 902 is coupled to the LUT 904, and arranged to search the LUT 904 for the constellation type indicated by the constellation type information $INF_{type}$ and utilize a pre-built phase rotation angle of a predetermined constellation type that matches the constellation type as the phase rotation angle φ.

Alternatively, the phase rotator controller 106 may be configured to decide the phase rotation angle φ by arithmetic computations. For example, information of the transmitter architecture employed by the digital RF transmitter 112 may be recorded in the phase rotator controller 106. In addition, inherent characteristics of digital power amplifier(s) of the digital RF transmitter 112 may be measured and recorded in the phase rotator controller 106. The phase rotator controller 106 may follow a pre-built algorithm to calculate an estimated phase rotation angle for the constellation type based on stored information of the digital RF transmitter 112. This also belongs to the scope of the present invention. Hence, no matter how the phase rotation angle φ is generated, any transmitter system using the proposed constellation phase rotation scheme to achieve lower PAPR, higher power efficiency and/or less distorted spectrum would fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmitter system, comprising:
   a digital phase rotator, arranged to receive a first constellation data and apply a digital phase rotation to the received first constellation data to generate a second constellation data;
   a phase rotation controller, arranged to configure the digital phase rotation; and
   a digital radio-frequency (RF) transmitter, arranged to receive a digital input data derived from the second constellation data, and process the digital input data for transmission of an analog RF output;

wherein the analog RF output is generated through at least one digital power amplifier; and a configuration of the digital phase rotation is dependent upon at least one characteristic of the digital RF transmitter.

2. The transmitter system of claim 1, wherein the phase rotation controller is arranged to refer to a constellation type of the first constellation data to set a phase rotation angle employed by the digital phase rotation.

3. The transmitter system of claim 2, wherein when the constellation type corresponds to a first modulation scheme, the phase rotation controller sets the phase rotation angle by a first angle value; and when the constellation type corresponds to a second modulation scheme different from the first modulation scheme, the phase rotation controller sets the phase rotation angle by a second angle value different from the first angle value.

4. The transmitter system of claim 2, wherein the phase rotation controller comprises:
 a lookup table, arranged to record a plurality of predetermined constellation types and a plurality of pre-built phase rotation angles, where the pre-built phase rotation angles are mapped to the predetermined constellation types, respectively; and
 a selector, arranged to search the lookup table for the constellation type, and utilize a pre-built phase rotation angle of a predetermined constellation type that matches the constellation type as the phase rotation angle.

5. The transmitter system of claim 1, wherein a configuration of the digital phase rotation is dependent upon transmitter architecture employed by the digital RF transmitter.

6. The transmitter system of claim 1, wherein a configuration of the digital phase rotation is dependent upon inherent characteristics of digital power amplifier(s) of the digital RF transmitter.

7. The transmitter system of claim 1, wherein a peak-to-average power ratio (PAPR) of the digital RF transmitter generating the analog RF output based on the digital input is lower than a PAPR of the digital RF transmitter generating an analog RF output based on a digital input derived from the first constellation data without the digital phase rotation applied thereto.

8. The transmitter system of claim 1, wherein a power efficiency of the digital RF transmitter generating the analog RF output based on the digital input is higher than a power efficiency of the digital RF transmitter generating an analog RF output based on a digital input derived from the first constellation data without the digital phase rotation applied thereto.

9. A signal transmission method, comprising:
 receiving a first constellation data;
 configuring a digital phase rotation;
 applying the digital phase rotation to the received first constellation data to generate a second constellation data; and
 utilizing a digital radio-frequency (RF) transmitter to receive a digital input data derived from the second constellation data and process the digital input data for transmission of an analog RF output;
 wherein the analog RF output is generated through at least one digital power amplifier; and a configuration of the digital phase rotation is dependent upon at least one characteristic of the digital RF transmitter.

10. The signal transmission method of claim 9, wherein the step of configuring the digital phase rotation comprises:
 referring to a constellation type of the first constellation data to set a phase rotation angle employed by the digital phase rotation.

11. The signal transmission method of claim 10, wherein when the constellation type corresponds to a first modulation scheme, the phase rotation angle is set by a first angle value; and when the constellation type corresponds to a second modulation scheme different from the first modulation scheme, the phase rotation angle is set by a second angle value different from the first angle value.

12. The signal transmission method of claim 10, wherein the step of referring to the constellation type to set the phase rotation angle comprises:
 searching a lookup table for the constellation type, wherein the lookup table records a plurality of predetermined constellation types and a plurality of pre-built phase rotation angles, and the pre-built phase rotation angles are mapped to the predetermined constellation types, respectively; and
 utilizing a pre-built phase rotation angle of a predetermined constellation type that matches the constellation type as the phase rotation angle.

13. The signal transmission method of claim 9, wherein a configuration of the digital phase rotation is dependent upon transmitter architecture employed by the digital RF transmitter.

14. The signal transmission method of claim 9, wherein a configuration of the digital phase rotation is dependent upon inherent characteristics of digital power amplifier(s) of the digital RF transmitter.

15. The signal transmission method of claim 9, wherein a peak-to-average power ratio (PAPR) of the digital RF transmitter generating the analog RF output based on the digital input is lower than a PAPR of the digital RF transmitter generating an analog RF output based on a digital input derived from the first constellation data without the digital phase rotation applied thereto.

16. The signal transmission method of claim 9, wherein a power efficiency of the digital RF transmitter generating the analog RF output based on the digital input is higher than a power efficiency of the digital RF transmitter generating an analog RF output based on a digital input derived from the first constellation data without the digital phase rotation applied thereto.

* * * * *